(12) United States Patent
Tomita et al.

(10) Patent No.: US 7,172,429 B2
(45) Date of Patent: Feb. 6, 2007

(54) METHOD OF MANUFACTURING SEMICONDUCTOR LIGHT EMITTING DEVICE

(75) Inventors: Nobuyuki Tomita, Tokyo (JP); Masayoshi Takemi, Tokyo (JP); Akihito Ohno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/326,509

(22) Filed: Jan. 6, 2006

(65) Prior Publication Data

US 2006/0166392 A1 Jul. 27, 2006

(30) Foreign Application Priority Data

Jan. 27, 2005 (JP) .............................. 2005-019468

(51) Int. Cl.
*H01L 21/00* (2006.01)
(52) U.S. Cl. .......................................... 439/47; 438/22
(58) Field of Classification Search ................. 438/22, 438/47
See application file for complete search history.

(56) References Cited

OTHER PUBLICATIONS

Nanostructure and carrier localization behaviors of green-luminscence InGaN/GaN quantum well structures of various silicon doping conditions, Applied Physics Letters, vol. 84, No. 14.*

M. Crawford, Optical Spectroscopy of InGaN Epilayer in the low indium Compoisition Regime, MRS Internet Journal Nitride Semiconductor Research, vol. 5S1, 2000.*
S. Chichibu et al., "Exciton Localization in InGaN Quantum Well Devices," J.Vac. Sci. Technol., 1998, B 16(4), pp. 2204-2214.
A. Kaneta et al., "Discrimination of Local Radiative and Non-Radiative Recombination processes in an InGaN/GaN Single-Quantum-Well Structure By A Time-Resolved Multimode Scanning Near-Field Optical Microscopy ,"Applied Physics Letters, Oct. 2003, vol. 83, No. 17, pp. 3462-3464.

* cited by examiner

*Primary Examiner*—B. William Baumeister
*Assistant Examiner*—Matthew L. Reames
(74) *Attorney, Agent, or Firm*—Leydig, Voit & Mayer, Ltd.

(57) ABSTRACT

The present invention provides a semiconductor light emitting device where a spatial change in an In composition ratio is small within a plane of an active layer and device properties such as efficiency of light emission are excellent, and a manufacturing method thereof. An active layer having an InGaN quantum well structure is formed in such a manner that a ratio of a photoluminescence light emission intensity at 300 K to a photoluminescence light emission intensity at 5 K becomes 0.1 or less. The ratio of the photoluminescence light emission intensity reflects the degree of the spatial change in an In composition ratio in a quantum confined structure. In addition, a smaller value indicates a higher spatial uniformity in the In composition ratio. Therefore, there is greater spatial uniformity in the In composition ratio in the active layer, increasing the probability of radiative recombination of carriers occurring, by making the ratio of photoluminescence light emission intensity 0.1 or less; thus, it becomes possible to obtain a semiconductor light emitting device having high efficiency in light emission.

8 Claims, 4 Drawing Sheets

METHOD OF MANUFACTURING SEMICONDUCTOR LIGHT EMITTING DEVICE

BACKGROUND OF THE INVENTION

1. Field of the Invention

The present invention relates to a semiconductor light emitting device that uses a III-V nitride-based compound semiconductor, and a manufacturing method thereof.

2. Description of the Background Art

In recent years, research and development of semiconductor lasers where an $Al_xGa_yIn_{1-x-y}N$ ($x \geq 0$, $y \geq 0$, $x+y=1$) III-V nitride-based compound semiconductor quantum confined structure is used as an active layer have been actively conducted for semiconductor light emitting devices which can emit light ranging from blue to ultraviolet rays that is required in order to increase the density of optical disks, and some have already used in practice. These are primarily fabricated by processing a wafer that includes a nitride-based compound semiconductor layer where a crystal of a III-V nitride-based compound semiconductor has been grown on a sapphire substrate.

It is known that, in an $Al_xGa_yIn_{1-x-y}N$ ($x \geq 0$, $y \geq 0$, $x+y=1$) III-V nitride-based compound semiconductor of which the crystal has been grown on a sapphire substrate via a so-called "low temperature buffer layer", highly dense penetration dislocations of about $10^9/cm^2$ are formed, due to the difference in the lattice constant between sapphire and $Al_xGa_yIn_{1-x-y}N$.

This density corresponds to the existence of a penetration dislocation in a square region of which one side is almost 1 μm. It is considered that such a penetration dislocation becomes the center of non-radiative recombination where electrons and holes which thermally move are captured, so that they are made to disappear during the process of non-radiative recombination.

Accordingly, it is considered that in order to achieve high efficiency in light emission, space regions where the difference in the energy level between electrons and holes is relatively small may be locally formed with high density, so that electrons and holes may be prevented from being captured in the center of non-radiative recombination such as penetration dislocation.

In fact, it has become clear, through experimentation using cathode luminescence measurements (see, for example, S. Chichibu et al., "Exciton localization in InGaN quantum well devices", J. Vac. Sci. Technol., 1998, B16(4), p2204–2214), near field optical microscope measurements (see, for example, A. Kaneta et al., "Discrimination of local radiative and non-radiative recombination processes in an InGaN/GaN single-quantum-well structure by a time-resolved multimode scanning near-field optical microscopy", "Applied Physics Letters", 27 Oct. 2003, Volume 83, Number 17, p. 3462–3464) and the like, that a high In region having a size on a nanometer scale (so-called "quantum disc" or "quantum dot") is formed in a well layer in a quantum well structure where the well layer is made of $In_{x1}Ga_{1-x1}N$ and the barrier layer is made of $In_{x2}Ga_{1-x2}N$ ($x1 > x2 \geq 0$).

It is considered that macroscopically, the reason why such a high In region is formed is based on the difference in the solid solubility between In and Ga in an InGaN mixed crystal. In addition, it is considered that microscopically, the cause is based on the substantial difference in the atomic size between In and Ga, such that stability of energy in the system is achieved by the integration of In at the temperature where the crystal is grown.

The size of high In region and the difference in the composition vis-à-vis the surroundings in such an InGaN mixed crystal can be controlled to a certain extent by adjusting a variety of growth conditions such as the growth temperature at the time of crystal growth, the V/III ratio, the amount of flow of hydrogen, and the growth rate. However, the bonding energy differs to a great extent between In—N and Ga—N; therefore, it is difficult to make the distribution of In in the crystal uniform, in comparison with AlGaInAsP-based mixed crystals, which are typical compound in the conventional art.

As described above, in the case where an $Al_xGa_yIn_{1-x-y}N$-based compound semiconductor is used, in particular, $In_{x1}Ga_{1-x1}N$ is used for the quantum well layer, a high In composition region is locally formed in a natural manner, and this constrains electrons and holes and prevents electrons and holes from moving into penetration dislocations. As a result, a light emitting device using a nitride semiconductor crystal that has been grown on a sapphire substrate has relatively excellent device properties, in spite of the fact that the density of penetration dislocations in the crystal is about $10^9/cm^2$, which is extremely high.

The optical properties of a crystal for a quantum confined structure, such as a quantum well structure, as described above, can be evaluated by the peak intensity of emitted light in the photoluminescence properties, primarily at room temperature. Semiconductor light emitting devices which are widely used are assumed to be utilized at room temperature; therefore, good photoluminescence properties at room temperature become the determination standard for evaluating the optical properties of the quantum confined structure.

In the case where the bonding energy of excitons is ignored, photoluminescence measurement is one of the most common optical evaluation methods in compound semiconductors where the structure that becomes the object of measurement is irradiated with a laser beam having a wavelength that is shorter than the wavelength that corresponds to the energy for the quantum confinement in the structure, that is, the difference in the energy level between electrons and holes and the light that is radiated from this structure is separated into a spectrum so that the intensity thereof can be measured.

Strictly speaking, the physical light emitting process is different between an actual semiconductor light emitting device and the light emitting process in the photoluminescence measurement. That is, in a semiconductor light emitting device, a current is injected and, thereby, electrons and holes are introduced into the quantum confined structure. On the other hand, in the photoluminescence measurement, the quantum confined structure is irradiated with a laser beam and, thereby, electrons and holes are generated.

In addition, in a semiconductor laser device having an extremely high electron and hole density in the quantum confined structure, Coulomb interaction which works between electrons and holes is blocked by electron-electron scattering, and this can be ignored. However, in the photoluminescence measurement, the intensity of the conventionally radiated laser beam is relatively faint; therefore, the density of electrons and holes which are generated in the quantum confined structure is small, and excitons are formed between electrons and holes due to Coulomb interaction, and after that, radiative recombination occurs.

As described above, physically, there is a slight difference between the light development mechanism in an actual semiconductor light emitting device and the light emission mechanism in the photoluminescence measurement. However, the photoluminescence measurement is frequently used as a technique for directly and simply evaluating the optical properties of the quantum confined structure, and can be said to be the most common optical evaluation technique.

In fact, in the case of a device of which the intensity of outputted light is relatively faint, it is considered that the stronger the photoluminescence intensity is at room temperature, the better efficiency of light emission is obtained in a semiconductor light emitting device that includes a quantum confined structure of which the crystal has been grown on a sapphire substrate.

As described above, in the InGaN quantum well layer having high photoluminescence intensity at room temperature of which the crystal has been grown on a sapphire substrate, spatial change in the In composition ratio suppresses the movement of carriers within the plane of the well layer. As a result, non-radiative recombination in defects such as penetration dislocations are prevented; thus, relatively excellent device properties are exhibited.

A spatial change (fluctuation) in this In composition ratio within the plane of the active layer, however, simultaneously causes spatial non-uniformity in the difference in the confining energy between electrons and holes in the InGaN quantum well layer; therefore, the effective volume of the semiconductor light emitting region that can contribute to light emission is reduced in a semiconductor light emitting device for outputting light having a specific wavelength. As a result, this becomes optical a factor in deteriorating the device properties, such as efficiency of light emission.

SUMMARY OF THE INVENTION

An object of the present invention is to provide a semiconductor light emitting device where spatial change in In composition ratio within a plane of an active layer is small and device properties such as efficiency of light emission are excellent, and a manufacturing method thereof.

According to a first aspect of the present invention, a manufacturing method of a semiconductor light emitting device where a quantum confined structure that includes In, Ga and N is used as an active layer includes the steps of: obtaining formation conditions for the quantum confined structure, where a ratio of a value of a photoluminescence light emission peak intensity at 300 K to a value of that at 5 K becomes 0.1 or less; and forming the quantum confined structure under the formation conditions.

According to the present invention, it is possible to manufacture a semiconductor light emitting device where the photoluminescence light emission peak intensity ratio of the quantum confined structure that includes In, Ga and N is 0.1 or less.

The photoluminescence light emission peak intensity ratio reflects the degree of the spatial change in the In composition ratio in the quantum contained structure. Thus, the smaller the value of the light emission peak intensity ratio is, the smaller the degree of the spatial change is in the In composition ratio.

Therefore, a quantum confined structure is formed in schematically a manner that the photoluminescence light emission peak intensity ratio becomes a predetermined value or less, so that it is possible to obtain a quantum confined structure where the fluctuation in the In composition ratio is small.

The fluctuation in the In composition ratio becomes small, and as a result, a semiconductor light emitting device having high efficiency of light emission, where radiative recombination of carriers occurs with a high degree of probability, can be obtained.

In addition, the ratio of carriers that do not contribute to light emission can be reduced; therefore, relevant device properties can be improved, in such a manner as to reduce the consumed power.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

First, the characteristics of the semiconductor light emitting device according to this embodiment and the working effects thereof are described.

It is considered that the existence of spatial fluctuation in the In composition ratio in a quantum confined structure, such as a quantum well structure, makes the device properties, such as efficiency of light emission of a semiconductor light emitting device having a specific wavelength of emitted light, deteriorate in a GaN substrate where the density of penetration dislocations is low.

Thus, it is considered that the change in the light emission peak intensity (hereinafter in some cases simply referred to as "light emission intensity") in the photoluminescence measurement corresponding to a change in the temperature directly reflects the degree of the spatial fluctuation in the In composition ratio in this quantum confined structure, as described below.

Therefore, it is considered that a quantum confined structure where the light emission intensity becomes as small as possible at room temperature and as great as possible at a low temperature is utilized for a light emitting layer (active layer) of a semiconductor light emitting device. Thereby, the spatial fluctuation in the In composition ratio becomes small. As a result, the spatial non-uniformity in the difference in the confining energy between electrons and holes becomes small, which is effective for improving device properties, such as efficiency of light emission in the semiconductor light emitting device.

The semiconductor light emitting device according to this embodiment is made of multiple layer hetero junctions of an $Al_xGa_yIn_{1-x-y}N$ ($x \geq 0$, $y \geq 0$, $x+y=1$) III-V nitride-based compound semiconductor, has a feature in that a quantum confined structure where the ratio (IH/IL) of the photoluminescence light emission intensity from the semiconductor quantum confined structure where electrons and holes are substantially confined in a spatial region from 0.1 nm to 50 nm at 300 K (IH) to the photoluminescence light emission intensity at 5 K (IL) is 0.1 or less is used for the light emitting layer.

In addition, a quantum well structure (quantum confined structure) where the photoluminescence light emission intensity ratio IH/IL at room temperature is small, that is, a quantum well structure having $In_{x1}Ga_{1-x1}N$ as a well layer and $In_{x2}Ga_{1-x2}N$ (x1>x2≧0) as a barrier layer is grown as a crystal on a GaN substrate of which the density of penetration dislocation is about $10^5/cm^2$. As a result of the experiment described later, it became clear that the efficiency of light emission of a semiconductor light emitting device having a specific wavelength of emitted light that has been fabricated using the aforementioned quantum well structure is significantly superior to the efficiency of light emission of the aforementioned semiconductor light emitting device that has been fabricated using a quantum well structure where the light emission intensity ratio IH/IL is great.

Though the phenomenon where a quantum confined structure having a weak photoluminescence light emission intensity at room temperature provides excellent properties in a semiconductor light emitting device may seem contradictory at a first glance, the light emission processes of the two can be understood as follows on the basis of physical consideration.

That is, the ratio of the photoluminescence light emission intensity at room temperature to that at a low temperature reflects the fluctuation in the In composition ratio. Electrons and holes that have been generated through optical excitation move to a region where the In composition ratio is locally great, that is, a region where the difference in the quantum energy level between electrons and holes is relatively small, so as to form excitons, and after that, photons are released through radiative recombination.

At this time, the spatial fluctuation in the In composition ratio is small. Accordingly, in the case where the quantum confining energy is uniform within the quantum well, electrons and holes spatially diffuse due to thermal energy. As a result, the electrons and holes are made to disappear through non-radiative recombination in penetration dislocations, or by being scattered by phonons or the like; thus, no photons are released. The probability of such non-radiative recombination occurring increases as the temperature rises. Accordingly, the ratio IH/IL of the photoluminescence light emission intensity at room temperature to that at a low temperature always becomes a value that is smaller than 1.

In addition, it becomes possible for the difference in the quantum energy level between electrons and holes to change from a relatively small region to a large region as the temperature increases. As a result of this, electrons and holes move to penetration dislocations, where non-radiative recombination occurs. Therefore, the change in this photoluminescence light emission intensity in accordance with a change in the temperature directly reflects the fluctuation in the In composition ratio and becomes an indicator through which the uniformity of the In composition ratio can be identified.

That is, it is considered that the light emission intensity ratio IH/IL corresponds to the degree of fluctuation in the In composition ratio, and this means that the smaller this ratio is, the higher the spatial uniformity of In is.

Meanwhile, in a semiconductor light emitting device, such as a semiconductor laser, the density of electrons and holes within the quantum well becomes significantly high due to optical feedback, as compared with the case of the photoluminescence measurement. As a result of this, the physical process of light emission is different from that in the case of photoluminescence.

In a semiconductor light emitting device, such as a semiconductor laser, for example, electron-electron scattering becomes significant, making the length of diffusion of carriers short. As a result, the influences of non-radiative recombination in penetration dislocations becomes small.

In the case where the fluctuation in the In composition ratio is large, an increase in the distribution of the energy of photons becomes significant due to the spatial fluctuation in the energy level of electrons and holes. That is, in the case where the fluctuation in the In composition ratio is great, the volume for generating photons having specific energy is reduced, and as a result, the efficiency of light emission from the device as a whole is lowered.

In conventional GaAs substrates and InP substrates, the density of penetration dislocations is extremely low. Therefore, even in the case where no fluctuation exists in the composition ratio in the quantum well structure of which the crystal has been grown on the substrates, the influences of diffusion of carriers to penetration dislocations through thermal diffusion and non-radiative recombination on the photoluminescence properties is almost negligible.

In GaN substrates, however, the density of penetration dislocations is high, in comparison with those of GaAs substrates and InP substrates. Therefore, the photoluminescence properties of the quantum well structure containing In of which the crystal has been grown on the substrates heavily depend on the degree of fluctuation in the In composition ratio. In the case where no fluctuation exists in the composition ratio, the photoluminescence light emission intensity at room temperature is significantly lowered. As described above, the density of penetration dislocations in the substrate greatly differs between GaAs-based substrates, InP-based substrates and GaN-based substrates, and thereby, the optical properties of the quantum well structure of which the crystal is grown on the substrate, in particular, photoluminescence properties, greatly differ.

As described above, the quantum confined structure where photoluminescence light emission intensity is weak at room temperature provides excellent properties for semiconductor light emitting devices because of the phenomena characteristic in GaN-based substrates. In the quantum confined structure where the photoluminescence light emission intensity is weak at room temperature, the degree of the In composition modification is small, in terms of physics. In other words, electron and hole confining energy in the quantum confined structure is spatially uniform in a semiconductor light emitting device, and this can be said to be the result of reflection where the volume that contributes to light emission is relatively large.

Accordingly, in a semiconductor light emitting device, such as a semiconductor laser that has been fabricated on a GaN substrate having a low density of penetration dislocations, the fluctuation in the In composition ratio is reduced as much as possible, and a crystal having a quantum confined structure where the ratio IH/IL of photoluminescence light emission intensity at room temperature to that at a low temperature is small is used as an active layer, so that it becomes possible to improve efficiency of light emission in the device.

In the following, the configuration of a nitride-based semiconductor laser according to this embodiment is concretely described.

Figure 1:
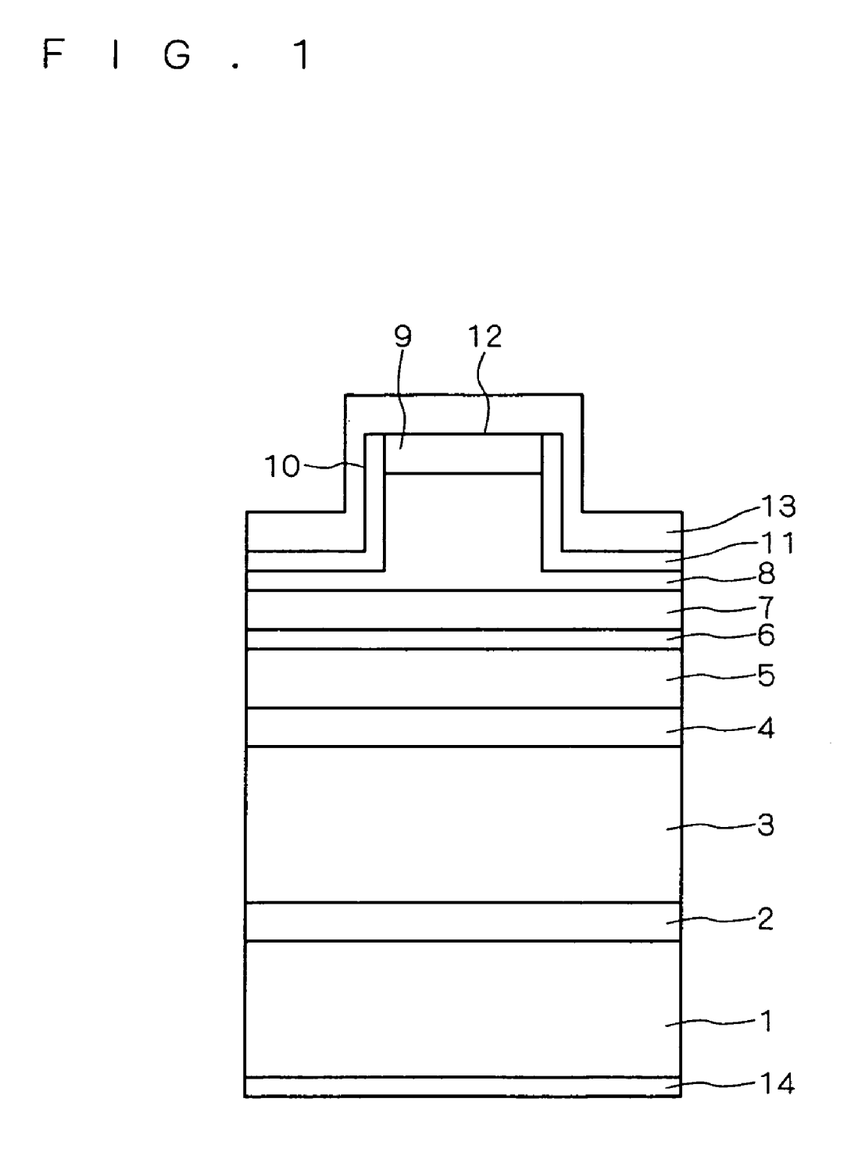
FIG. 1 is a sectional view showing the structure of a nitride-based semiconductor laser according to a first embodiment.

FIG. 1 is a sectional view showing the structure of a nitride-based semiconductor laser according to this embodiment.

The nitride-based semiconductor laser according to this embodiment has a ridge structure and an SCH (Separate Confinement Heterostructure) structure. In addition, an active layer 5 is formed of multiple layer heterojunctions of an $Al_xGa_yIn_{1-x-y}N$ ($x \geqq 0$, $y \geqq 0$, $x+y=1$)III-V nitride-based compound semiconductor ($x=0$ in the example of this embodiment).

As shown in FIG. 1, in the nitride-based semiconductor laser according to this embodiment, an n-type GaN layer 2 is formed on a Ga surface which is a main surface of a GaN substrate 1. This is in order to further flatten the unevenness that exists on the surface of the GaN substrate 1 on a nanometer scale.

Then, on top of this n-type GaN layer 2, an n-type $Al_{x1}Ga_{1-x1}N$ clad layer 3, an n-type GaN optical guide layer 4 which works as an n-side optical guide layer, the active layer 5 having, for example, an undoped $In_{y1}Ga_{1-y1}N/In_{y2}Ga_{1-y2}N$ multiple quantum well structure, a p-type $Al_{x2}Ga_{1-x2}N$ electron barrier layer 6, a p-type GaN optical guide layer 7 which works as a p-side guide layer, a p-type $Al_{x3}Ga_{1-x3}N$ clad layer 8 which works as a p-side clad layer, and a p-type GaN contact layer 9 are sequentially layered.

Here, the n-type GaN layer 2 has a thickness of, for example, 100 nm, and silicon (Si), for example, is doped as an n-type impurity. The n-type $Al_{x1}Ga_{1-x1}N$ clad layer 3 has a thickness of, for example, 1 µm, and Si, for example, is doped as an n-type impurity, and the Al composition ratio x1 is, for example, 0.07. In the active layer 5 having an $In_{y1}Ga_{1-y1}N/In_{y2}Ga_{1-y2}N$ multiple quantum well structure, $In_{y2}Ga_{1-y2}N$ layers which work as barrier layers and $In_{y1}Ga_{1-y1}N$ layers which work as well layers are alternately layered, where an $In_{y2}Ga_{1-y2}N$ layer which works as a barrier layer has a thickness of, for example, 7 nm, y2=0.02, an $In_{y1}Ga_{1-y1}N$ layer which works as a well layer has a thickness of 3.5 nm, y1=0.14 and the number of wells is 3.

Here, a quantum confined structure where the ratio (IH/IL) of the photoluminescence light emission intensity (IH) at 300 K to the photoluminescence light emission intensity (IL) at 5 K is 0.1 or less is used in the active layer 5.

The p-type $Al_{x2}Ga_{1-x2}N$ electron barrier layer 6 has a thickness of, for example, 10 nm, and the Al composition ratio x2 is, for example, 0.2. The p-type GaN optical guide layer 7 has a thickness of, for example, 100 nm. The p-type $Al_{x3}Ga_{1-x3}N$ clad layer 8 which works as a p-side clad layer has a thickness of, for example, 400 nm, Mg, for example, is doped as a p-type impurity, and the Al composition ratio x3 is, for example, 0.07. The p-type GaN contact layer 9 has a thickness of, for example, 100 nm, and magnesium (Mg), for example, is doped as a p-type impurity.

A ridge 10 is formed in the p-type $Al_{x3}Ga_{1-x3}N$ clad layer 8 and the p-type GaN contact layer 9, for example, parallel to the <1–100>direction through etching. The width of this ridge 10 is, for example, 2 µm.

An insulating film 11 is formed of an $SiO_2$ film having a thickness of, for example, 200 nm, so as to cover the ridge 10, in order to protect the surface of the portions of the sides of this ridge or lateral bottom portions of the ridge, as well as in order to provide electrical insulation. An opening 12 is provided in a portion of this insulating film 11, on top of the ridge 10, and a p electrode 13 and the p-type GaN contact layer 9 make electrical connection through this opening 12. The p electrode 13 has a structure where Pd and Au films, for example, are sequentially layered.

In addition, an n electrode 14 is formed on an N surface, on the side opposite to the Ga surface, which is the main surface of the GaN substrate 1. This n electrode 14 has a structure where Ti and Au films, for example, are sequentially layered.

Next, a manufacturing method of a nitride semiconductor laser according to this embodiment is described.

First, an n-type GaN layer 2 is grown at a growth temperature of, for example, 1200° C., in accordance with a metal organic chemical vapor deposition (MOCVD) method on a GaN substrate 1 of which the surface has been cleaned in advance through thermal cleaning. After that, an n-type $Al_{x1}Ga_{1-x1}N$ clad layer 3, an n-type GaN optical guide layer 4, an active layer 5 made of an undoped $In_{y1}Ga_{1-y1}N/In_{y2}Ga_{1-y2}N$ multiple quantum well layer, a p-type $Al_{x2}Ga_{1-x2}N$ electron barrier layer 6, a p-type GaN optical guide layer 7, a p-type $Al_{x3}Ga_{1-x3}N$ clad layer 8, and a p-type GaN contact layer 9 are sequentially layered, also in accordance with an MOCVD method.

Here, in the case of an AlGaInAsP-based compound semiconductor, the conditions of crystal growth can be almost controlled by adjusting the temperature of the substrate, the V/III ratio and the growth rate; thus, a quality of crystal having essentially the same physical properties can be provided without depending on the type of a crystal growth apparatus. This is because the difference in the bonding energy between III group atoms and V group atoms is small relative to the bonding energy of III group atoms, and in addition, the vapor pressure of V group atoms is relatively high.

In an $Al_xGa_yIn_{1-x-y}N$ ($x \geqq 0$, $y \geqq 0$, $x+y=1$) III-V nitride-based compound semiconductor, such as the semiconductor light emitting device according to this embodiment, however, the bonding energy between V group atoms and In atoms is extremely small in comparison with the bonding energy between V group atoms and other III group atoms. Therefore, in the case where In is included, the temperature for growth needs to be lower by about 400° C. than in the case where it is not included.

As described above, in an $Al_xGa_yIn_{1-x-y}N$ III-V nitride-based compound semiconductor, at the time of crystal growth, temperatures for growth which differ greatly from each other become necessary for layers that include In and layers that do not include In. Therefore, control of the temperature for growth with high precision becomes extremely important.

In addition, in the case where a crystal of a nitride-based compound semiconductor is grown in accordance with a metal organic vapor deposition method, it is necessary to introduce ammonium, hydrogen and nitrogen into the apparatus, and an extremely complicated physicochemical reaction occurs as a result of the interaction between these gas molecules, and the interaction between these gas molecules and material gases that become III group atomic species, as well as between these gas molecules and atoms on the surface of the substrate.

Accordingly, it is insufficient only to control the temperature of the substrate, the V/III ratio, the growth rate and the like, as in conventional AlGaInAsP-based compound semiconductors in order to always obtain the same crystal. It can be said to be more realistic to use the optical and electrical properties of the crystal as indicators, in order to identify essential crystallinity. The growth conditions shown below in the embodiment of the present invention are inherent to the crystal growth apparatus that is utilized in the implementation of the present invention, and it is considered that the growth conditions naturally differ in the case where the crystal growth apparatus is different.

In this embodiment, as for the temperature for growing each layer that forms the semiconductor light emitting device, the temperature is set at, for example, 1200° C., for the n-type $Al_{x1}Ga_{1-x1}N$ clad layer 3 and the n-type GaN optical guide layer 4, at 800° C. for the active layer 5, and at 1100° C. for the layers from the p-type $Al_{x2}Ga_{1-x2}N$ electron barrier layer 6 to the p-type GaN contact layer 9.

Here, though the temperature for growing the active layer 5 is set at, for example, 800° C., it is not necessary for this temperature, which strongly depends on the MOCVD apparatus, to be set at 800° C.

In addition, the amount of flow of each type of gas is adjusted and modification of the In composition of $In_{y1}Ga_{1-y1}N$ is suppressed, so that the growth conditions (formation conditions) for making the ratio (IH/IL) of the photoluminescence light emission intensity at 300 K (IH) to the photoluminescence light emission intensity at 5 K (IL) 0.1 or less in the quantum confined structure are obtained.

In order to obtain these formation conditions, samples are fabricated under a plurality of formation conditions, by changing the parameters for the formation conditions, such as the amount of flow of each type of gas, and a photoluminescence measurement is carried out on each sample. Thus, a sample of which the photoluminescence light emission intensity ratio is 0.1 or less is selected and the parameters for fabricating this sample are used as the formation conditions.

That is, the formation conditions are first obtained through the process for obtaining the formation conditions of a quantum confined structure of which the ratio of the value of the photoluminescence light emission peak intensity at 300 K to the value of that at 5 K is 0.1 or less, and a quantum confined structure is then formed under these formation conditions.

As described above, after the formation of the p-type GaN contact layer 9, a resist is applied to the entire surface of the substrate, and a resist pattern in a predetermined form which corresponds to the form of the mesa portion is formed through lithography. This resist pattern is used as a mask to etch the layers to the middle of the p-type $Al_{x3}Ga_{1-x3}N$ clad layer 8 in accordance with, for example, an RIE method. As a result of this etching, the ridge 10 having an optical wave guide structure is fabricated. A chlorine-based gas, for example, is used as the etching gas for this RIE.

Next, an insulating film 11, such as an $SiO_2$ film, having a thickness of, for example, 200 nm, is formed, also on the entirety of the substrate, in accordance with, for example, a CVD method, a vacuum deposition method, a sputtering method or the like, with the resist pattern that has been used as a mask left as it is, and then, the portion of the insulating film 11 on the ridge is removed at the same time as the removal of the resist, that is, so-called lift-off is carried out. As a result of this, an opening 12 is formed on the ridge 10.

Next, Pt and Au films are sequentially formed on the entire surface of the substrate in accordance with, for example, a vapor deposition method. After that, a p electrode 13 is formed on the surface through the application of a resist, lithography, and wet etching or dry etching.

After that, Ti and Al films are sequentially formed on the entirety of the rear surface of the GaN substrate 1 in accordance with a vapor deposition method. An alloy process for making the n electrode 14 make ohmic contact with the substrate is carried out.

Furthermore, this substrate is processed into bars through cleavage or the like, so as to form two end surfaces of a resonator. Furthermore, end surface coating is applied to these end surfaces of the resonator. After that, the bars are converted to chips through cleavage or the like.

As a result, a nitride-based semiconductor laser as that shown in FIG. 1 is fabricated.

Next, the effects of the nitride-based semiconductor laser that has been formed as described above are described.

Figure 2:
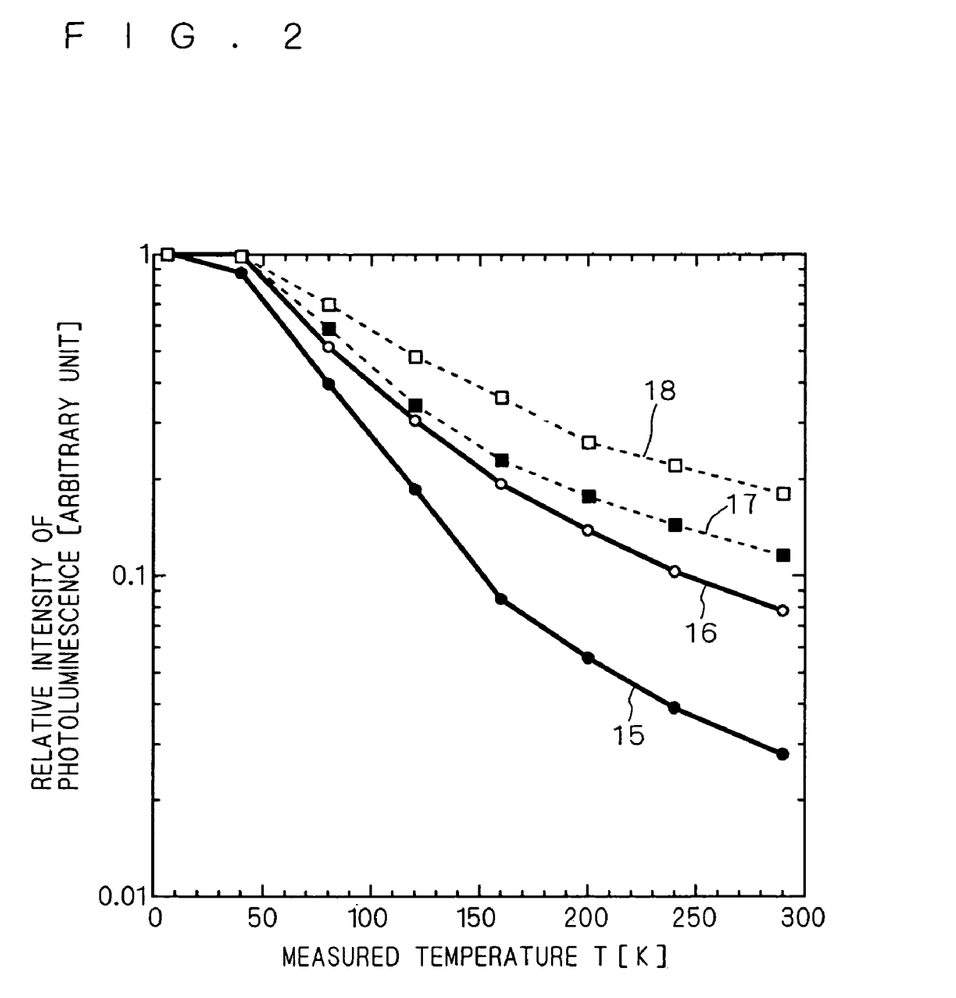
FIG. 2 is a graph showing the dependence of a photoluminescence relative intensity on a temperature according to the first embodiment.

FIG. 2 is a graph showing the change in the photoluminescence light emission intensity (light emission peak intensity) of the active layer 5 that has been normalized with the light emission intensity at 300 K in accordance with a change in the temperature. The probability of non-radiative recombination occurring increases, and thus, the intensity of light emission lowers as the temperature increases, and it can be seen that the degree of reduction in the intensity of light emission changes on the basis of the growth conditions for MOCVD as the temperature increases.

FIG. 2 shows the change in the photoluminescence light emission intensity of nitride-based semiconductor lasers 15 to 18, which have been fabricated by changing the growth conditions of the active layer 5, in accordance with the change in the temperature. Thus, the numbers 15 to 18 are attached, in this order, starting from the nitride-based semiconductor laser having the smallest ratio of light emission intensity. The nitride-based semiconductor lasers 15 and 16 have a ratio of light emission intensity that is 0.1 or less, and the nitride-based semiconductor lasers 17 and 18 have a ratio of light emission intensity that is greater than 0.1.

Figure 3:
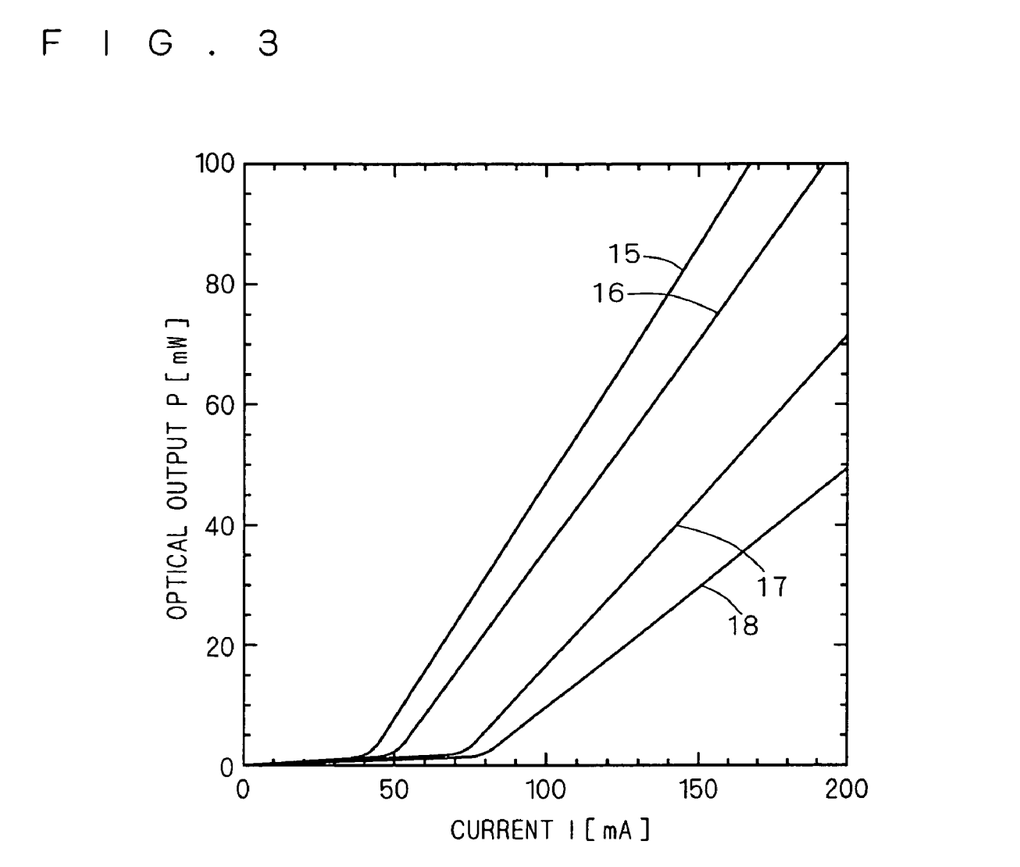
FIG. 3 is a graph showing the optical output-current characteristics of the nitride-based semiconductor laser according to the first embodiment.

FIG. 3 shows the optical output-current characteristics of the nitride-based semiconductor lasers 15 to 18, which have been fabricated under the respective growth conditions. From this graph, it can be seen that the threshold current and the efficiency of light emission have improved in the semiconductor lasers 15 and 16, where the quantum well structure having a ratio of photoluminescence light emission intensity that is 0.1 or less is used as a light emitting layer, as compared to the layers of which the ratio of photoluminescence light emission intensity is greater than 0.1.

Figure 4:
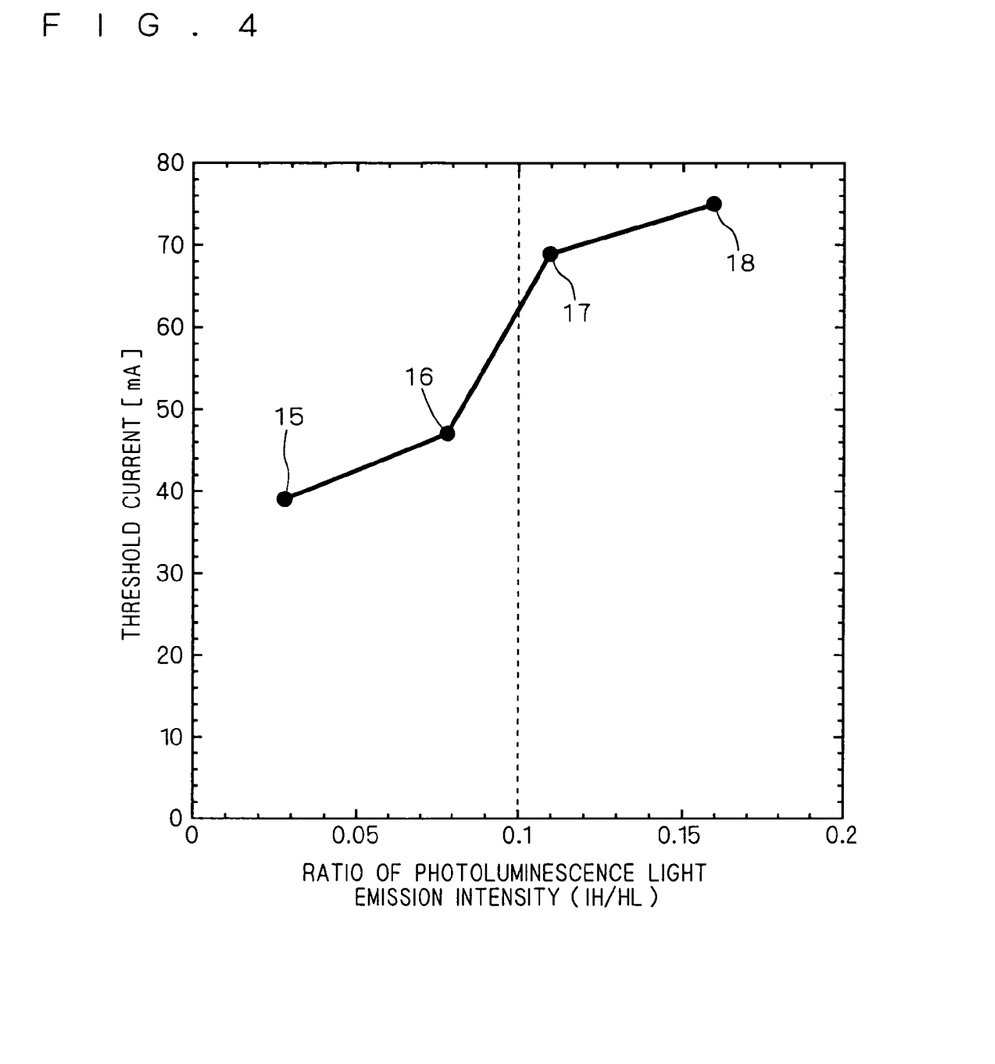
FIG. 4 is a graph showing the relationship between the photoluminescence light emission intensity ratio and the threshold current according to the first embodiment.

FIG. 4 is a graph showing the threshold current (longitudinal axis) relative to the ratio IH/IL of the photoluminescence light emission intensity (lateral axis) of the nitride-based semiconductor lasers 15 to 18, which have been fabricated under the respective growth conditions.

As can be seen from FIG. 4, the threshold current lowers as the ratio of the photoluminescence light emission intensity becomes smaller. In addition, it can be seen that the threshold current significantly lowers when the ratio of the photoluminescence light emission intensity is smaller than 0.1.

As described above, in accordance with the manufacturing method of a semiconductor light emitting device according to this embodiment, a semiconductor light emitting device of which the ratio of the photoluminescence light emission intensity at 300 K to that at 5 K becomes 0.1 or less in the quantum confined structure can be manufactured. As a result of this, fluctuation in the In composition ratio becomes smaller in the quantum well structure; therefore, the device properties, for example, the efficiency of light emission can be improved.

Here, though a case where a GaN substrate is used is described in this embodiment, it is considered that the same physical phenomenon occurs with a sapphire substrate on which so-called "growth in lateral direction" is carried out after a low temperature buffer layer has been grown, and thereby, the density of penetration dislocations due to the difference in the lattice constant between sapphire and GaN lowers on the surface of the grown crystal.

Accordingly, the present invention is not limited only to semiconductor light emitting devices of which the crystal has been grown on a GaN substrate, but rather, can be applied to devices of which the GaN crystal has been grown on a substrate that is different from GaN, such as a sapphire substrate, an SiC substrate or an Si substrate, where the density of penetration dislocations has been reduced on the surface using a technique such as growth in the lateral direction.

However, a GaN substrate is used as in the semiconductor light emitting device according to this embodiment, so that the process for growth in the lateral direction which becomes necessary in the case where a sapphire substrate is used can be omitted.

In addition, the density of penetration dislocations is lowered by using a GaN substrate, and the lifetime of the device can be made longer.

In addition, though a semiconductor laser is described in this embodiment, the semiconductor light emitting device is not limited only to a semiconductor laser, and the present invention can be applied to a light emitting diode. In a semiconductor laser, however, optical feedback occurs; therefore, the device properties can be further improved, in comparison with a case where the invention is applied to a light emitting diode.

Furthermore, the quantum confined structure is not limited to the quantum well structure, but may be a quantum fine line structure, a quantum dot structure or the like.

The quantum well structure, however, can be easily formed by layering well layers and barrier layers, in comparison with the quantum fine line structure and the quantum dot structure.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor light emitting device having an active layer with a quantum confined structure including layers of InGaN, the method comprising:

forming under a plurality of different formation conditions a plurality of respective quantum confined structures, each of the quantum confined structures including a plurality of alternating layers of InGaN containing respective proportions of In, Ga, and N, and measuring photoluminescence peak intensities of each of the plurality of quantum confined structures at 300° K and 5° K to identify the formation conditions producing quantum confined structures having a ratio of peak photoluminescence intensities at 300° K and 5° K no larger than 0.1; and manufacturing a semiconductor light emitting device by successively forming on a substrate opposite conductivity type first and second cladding layers of AlGaN and, between depositing the first and second cladding layers, forming a layer including a quantum confined structure including a plurality of layers of InGaN using the formation conditions identified as producing a quantum confined structure having a ratio of peak photoluminescence intensities at 300° K and 5° K no larger than 0.1.

2. The method according to claim 1 including, in manufacturing the semiconductor light emitting device, forming a multiple quantum well structure as the quantum confined structure, the multiple quantum well structure including alternating well and barrier layers of InGaN with respective different concentrations of In and Ga.

3. The method according to claim 1 including, in manufacturing the semiconductor light emitting device, successively depositing on a GaN substrate, the first of the AlGaN cladding layers, a first GaN optical guide layer, the quantum confined structure, a second GaN optical guide layer, and the second AlGaN cladding layer.

4. The method according to claim 1 including forming the plurality of quantum confined structures by metal organic chemical vapor deposition with, as different formation conditions, different deposition temperatures and different flow rates of respective source gases for supplying constituents of the layers of the quantum confined structure.

5. A method of manufacturing a semiconductor light emitting device having an active layer with a quantum confined structure including layers of InGaN, the method comprising:

forming under a plurality of different formation conditions a plurality of respective quantum confined structures, each of the quantum confined structures including a plurality of alternating layers of InGaN containing respective proportions of In, Ga, and N, the formation conditions producing quantum confined structures having a ratio of peak photoluminescence intensities at 300° K and 5° K no larger than 0.1; and manufacturing a semiconductor light emitting device by successively forming on a substrate opposite conductivity type first and second cladding layers of AlGaN and, between depositing the first and second cladding layers, forming a layer including a quantum confined structure including a plurality of layers of InGaN using the formation conditions identified as producing a quantum confined structure having a ratio of peak photoluminescence intensities at 300° K and 5° K no larger than 0.1.

6. The method according to claim 5 including, in manufacturing the semiconductor light emitting device, forming a multiple quantum well structure as the quantum confined structure, the multiple quantum well structure including alternating well and barrier layers of InGaN with respective different concentrations of In and Ga.

7. The method according to claim 5 including, in manufacturing the semiconductor light emitting device, successively depositing on a GaN substrate, the first of the AlGaN cladding layers, a first GaN optical guide layer, the quantum confined structure, a second GaN optical guide layer, and the second AlGaN cladding layer.

8. The method according to claim 5 including forming the plurality of quantum confined structures by metal organic chemical vapor deposition with, as different formation conditions, different deposition temperatures and different flow rates of respective source gases for supplying constituents of the layers of the quantum confined structure.

* * * * *